(12) United States Patent
Machida

(10) Patent No.: US 9,564,421 B2
(45) Date of Patent: Feb. 7, 2017

(54) SEMICONDUCTOR DEVICE

(71) Applicant: SHINKO ELECTRIC INDUSTRIES CO., LTD., Nagano (JP)

(72) Inventor: Yoshihiro Machida, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 15/155,175

(22) Filed: May 16, 2016

(65) Prior Publication Data
US 2016/0351544 A1 Dec. 1, 2016

(30) Foreign Application Priority Data

May 28, 2015 (JP) .................................. 2015-108811

(51) Int. Cl.
H01L 23/48 (2006.01)
H01L 23/52 (2006.01)
(Continued)

(52) U.S. Cl.
CPC ......... *H01L 25/0657* (2013.01); *H01L 21/565* (2013.01); *H01L 23/3128* (2013.01); *H01L 23/3142* (2013.01); *H01L 23/49827* (2013.01); *H01L 23/49838* (2013.01); *H01L 24/17* (2013.01); *H01L 24/81* (2013.01); *H01L 25/50* (2013.01); *H01L 2224/13144* (2013.01); *H01L 2224/13147* (2013.01); *H01L 2224/16113* (2013.01); *H01L 2224/16227* (2013.01); *H01L 2224/16235* (2013.01); *H01L 2224/81203* (2013.01); *H01L 2225/0652* (2013.01); *H01L 2225/06517* (2013.01); *H01L 2225/06548* (2013.01); *H01L 2225/06572* (2013.01); *H01L 2225/06586* (2013.01); *H01L 2924/014* (2013.01); *H01L 2924/0105* (2013.01); *H01L 2924/01028* (2013.01);
(Continued)

(58) Field of Classification Search
USPC ......................... 257/686, 692, 772, E23.015, E23.02,257/E23.023–E23.079, E21.508–E21.509,257/E21.519, 625, 779–783, 784–785, E27.137,257/E27.144, E27.161, E23.077,257/E21.122–E21.128, E21.48, E21.512,257/E21.567–E21.57, E21.087–E21.088, 276,257/457, 459, 502, 503, 573, 584, 602, 621,257/664–677; 438/109, 612–617, 118, 406, 438/455–459, 25–28
See application file for complete search history.

(56) References Cited

U.S. PATENT DOCUMENTS 7,884,632 B2 * 2/2011 Shiraishi ............ G01R 1/06727
324/750.25
2004/0026107 A1 * 2/2004 Caldwell ................ H01L 24/10
174/557

FOREIGN PATENT DOCUMENTS

JP 2003-347722 12/2003

* cited by examiner

Primary Examiner — Tram H Nguyen
(74) Attorney, Agent, or Firm — IPUSA, PLLC

(57) ABSTRACT

A semiconductor device includes a first substrate, a second substrate stacked over the first substrate, and a pillar member extending obliquely between the first and second substrates. The first substrate includes a mounting surface on which a semiconductor chip is mounted, with a resin interposed between the semiconductor chip and the mounting surface and extending beyond the periphery of the semiconductor chip on the mounting surface. The first substrate further includes a first pad forming part of the mounting surface and disposed outside the resin. The second substrate includes a second pad forming part of its surface facing toward the mounting surface. The second pad at least overlaps the resin when viewed in a direction in which the second substrate is
(Continued)

stacked over the first substrate. The pillar member has first and second ends joined to the first and second pads, respectively, to electrically connect the first and second substrates.

7 Claims, 12 Drawing Sheets

(51) Int. Cl.
*H01L 25/065* (2006.01)
*H01L 23/31* (2006.01)
*H01L 23/498* (2006.01)
*H01L 23/00* (2006.01)
*H01L 21/56* (2006.01)
*H01L 25/00* (2006.01)

(52) U.S. Cl.
CPC ............... *H01L 2924/01029* (2013.01); *H01L 2924/01046* (2013.01); *H01L 2924/01047* (2013.01); *H01L 2924/01051* (2013.01); *H01L 2924/01079* (2013.01); *H01L 2924/01082* (2013.01); *H01L 2924/05442* (2013.01); *H01L 2924/0665* (2013.01); *H01L 2924/15747* (2013.01); *H01L 2924/186* (2013.01); *H01L 2924/19041* (2013.01); *H01L 2924/19043* (2013.01); *H01L 2924/19105* (2013.01)

SEMICONDUCTOR DEVICE

CROSS-REFERENCE TO RELATED APPLICATION

This application is based upon and claims the benefit of priority of the prior Japanese Patent Application No. 2015-108811, filed on May 28, 2015, the entire contents of which are incorporated herein by reference.

FIELD

A certain aspect of the embodiments discussed herein is related to semiconductor devices.

BACKGROUND

In recent years, semiconductor devices in which a semiconductor chip is embedded have been proposed in view of downsizing and space saving.

According to such semiconductor devices, for example, a first semiconductor chip is mounted face down on a surface of a first substrate by flip chip bonding, a second substrate is stacked on the surface of the first substrate with substrate connecting members such as solder balls between the first and the second substrate, and the space between the first and the second substrate is filled with mold resin. A second semiconductor chip is mounted on the second substrate. (See, for example, Japanese Laid-Open Patent Application No. 2003-347722.)

SUMMARY

According to an aspect of the embodiments, a semiconductor device includes a first substrate, a second substrate stacked over the first substrate, and a pillar member extending obliquely between the first and second substrates. The first substrate includes a mounting surface on which a semiconductor chip is mounted, with a resin interposed between the semiconductor chip and the mounting surface and extending beyond the periphery of the semiconductor chip on the mounting surface. The first substrate further includes a first pad forming part of the mounting surface and disposed outside the resin. The second substrate includes a second pad forming part of its surface facing toward the mounting surface. The second pad at least overlaps the resin when viewed in a direction in which the second substrate is stacked over the first substrate. The pillar member has first and second ends joined to the first and second pads, respectively, to electrically connect the first and second substrates.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Figure 1:
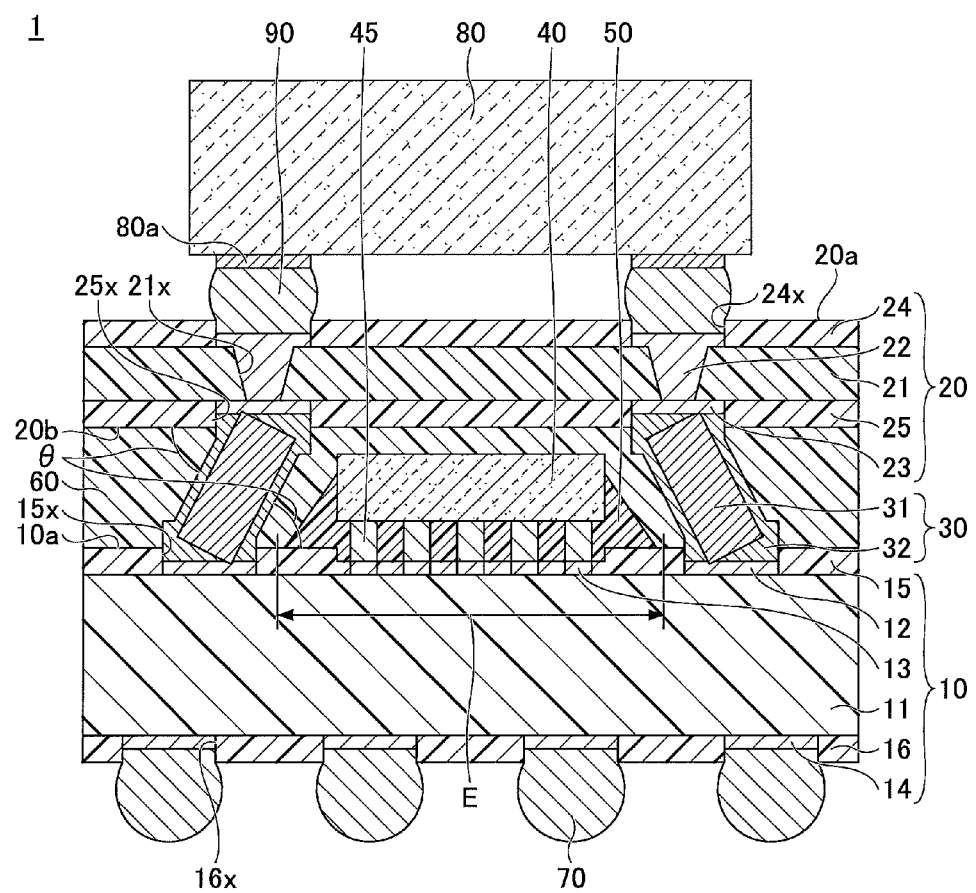
FIG. 1 is a cross-sectional view of a semiconductor device according to a first embodiment.

According to a semiconductor device in which a semiconductor chip is embedded as noted above, underfill resin may be provided between the first substrate and the first semiconductor chip. In this case, the underfill resin bleeds out to an area around the first semiconductor chip on the first substrate. This prevents the substrate connecting members from being provided in the area to which the underfill resin bleeds out. As a result, the positions of the substrate connecting members may be out of alignment with the positions of electrode terminals of the second semiconductor chip. In such a case, the wiring distance from the first substrate to the second semiconductor chip through the substrate connecting members is not minimized, which may lead to degraded performance or malfunction of the second semiconductor chip.

According to an aspect of the present invention, a semiconductor device is provided in which the wiring distance between a substrate and a semiconductor chip is reduced compared with conventional semiconductor devices.

Preferred embodiments of the present invention will be explained with reference to accompanying drawings. In the specification and the drawings, the same elements are referred to using the same reference numeral, and a repetitive description thereof may be omitted.

[a] First Embodiment

First, a structure of a semiconductor device according to a first embodiment is described. FIG. 1 is a cross-sectional view of a semiconductor device 1 according to the first embodiment.

Referring to FIG. 1, the semiconductor device 1 includes a first substrate 10, a second substrate 20, substrate connecting members 30, a first semiconductor chip 40, underfill resin 50 (a first resin), mold resin 60, bumps 70, a second semiconductor chip 80, and bumps 90. The second substrate 20 is stacked over the first substrate 10 with the substrate connecting members 30 interposed between the first substrate 10 and the second substrate 20.

According to this embodiment, for convenience of description, the second semiconductor chip 80 side of the semiconductor device 1 will be referred to as "upper side" or "first side," and the bumps 70 side of the semiconductor device 1 will be referred to as "lower side" or "second side." Furthermore, with respect to each part or element of the semiconductor device 1, a surface on the second semiconductor chip 80 side will be referred to as "upper surface" or "first surface," and a surface on the bumps 70 side will be referred to as "lower surface" or "second surface." The semiconductor device 1, however, may be used in an upside-down position or oriented at any angle. Furthermore, a plan view refers to a view of an object taken in a direction normal to the first surface of the first substrate 10, and a planar shape refers to the shape of an object viewed in a direction normal to the first surface of the first substrate 10. The direction normal to the first surface of the first substrate 10 may be considered as a direction in which the second substrate 20 is stacked over the first substrate 10.

The first substrate 10 includes an insulating layer 11, a wiring layer 12, pads 13, a wiring layer 14, and solder resist layers 15 and 16.

As the insulating layer 11, for example, a so-called glass epoxy substrate, which is glass cloth impregnated with an insulating resin, such as an epoxy resin, may be used. A substrate formed by impregnating woven or non-woven fabric of glass fibers, carbon fibers, or aramid fibers with an insulating resin, such as an epoxy resin, may also be used as the insulating layer 11. The thickness of the insulating layer 11 may be, for example, approximately 60 μm to approximately 200 μm. In the drawings, a depiction of glass cloth or the like is omitted.

The wiring layer 12 and the pads 13 are formed on the first surface of the insulating layer 11. The pads 13 are electrically connected to protruding electrodes 45, formed on electrodes (not depicted) of the first semiconductor chip 40, by solder (not depicted), for example. As the protruding electrodes 45, copper (Cu) posts or gold (Au) bumps may be used, for example.

Suitable materials for the wiring layer 12 and the pads 13 include, for example, copper. The thickness of the wiring layer 12 and the pads 13 may be, for example, approximately 10 μm to approximately 20 μm. The wiring layer 12 may be electrically connected to the wiring layer 14 through interconnects in the insulating layer 11. Furthermore, another wiring layer may be provided in the insulating layer 11 to make the first substrate 10 a multilayer wiring substrate. The pads 13 may be connected to the wiring layer 12 or 14 or another wiring layer provided in the insulating layer 11.

The wiring layer 14 is formed on the second surface of the insulating layer 11. The material and thickness of the wiring layer 14 may be the same as those of the wiring layer 12, for example.

The solder resist layer 15 is formed on the first surface of the insulating layer 11 to cover the wiring layer 12. The solder resist layer 15 may be formed of, for example, a photosensitive resin. The thickness of the solder resist layer 15 may be, for example, approximately 15 μm to approximately 35 μm. The solder resist layer 15 includes openings 15x, in each of which part of the wiring layer 12 is exposed. Part of the wiring layer 12 exposed in each opening 15x serves as a pad (first pad) that connects to one of the substrate connecting members 30.

The solder resist layer 16 is formed on the second surface of the insulating layer 11 to cover the wiring layer 14. The solder resist layer 16 may be formed of, for example, a photosensitive resin. The thickness of the solder resist layer 16 may be, for example, approximately 15 μm to approximately 35 μm. The solder resist layer 16 includes openings 16x, in each of which part of the wiring layer 14 is exposed. Part of the wiring layer 14 exposed in each opening 16x serves as a pad that connects to another wiring substrate.

A metal layer may be formed on the first surface of the wiring layer 12 exposed in the openings 15x and/or the second surface of the wiring layer 14 exposed in the openings 16x, as required. Suitable layers for the metal layer include, for example, a Au layer, a Ni/Au layer (a laminated metal layer of a Ni layer and a Au layer that are stacked in this order), and a Ni/Pd/Au layer (a laminated metal layer of a Ni layer, a Pd layer, and a Au layer that are stacked in this order). Instead of forming a metal layer, an anti-oxidation treatment, such as an organic solderability preservative (OSP) process, may be performed. A surface treatment layer formed by the OSP process is an organic coating formed of, for example, an azole compound or an imidazole compound.

The first semiconductor chip 40 is mounted face down on a first surface 10a of the first substrate 10 by flip chip bonding, so that the second surface of the first semiconductor chip 40, on which a circuit is formed, faces toward the first surface 10a of the first substrate 10. The first surface 10a of the first substrate 10 includes the first surface of the wiring layer 12 and the first surface of the solder resist layer 15.

The space between the second surface of the first semiconductor chip 40, which is on the same side as the protruding electrodes 45, and the first surface 10a of the first substrate 10 is filled with the underfill resin 50. The underfill resin 50 extends beyond the periphery of the first semiconductor chip 40. The underfill resin 50 may also cover the side surfaces (perpendicular to the second surface) of the first semiconductor chip 40. Suitable materials for the underfill resin 50 include, for example, an insulating resin, such as a thermosetting epoxy resin. The underfill resin 50 may contain a filler, such as silica ($SiO_2$).

In FIG. 1, "E" indicates a bleed-out area, which is the maximum area in which the underfill resin 50 flows. It is not possible to provide the openings 15x, each exposing part of the wiring layer 12 to serve as a pad, in the bleed-out area E. Accordingly, the openings 15x are disposed outside the bleed-out area E (outside the underfill resin 50) in a plan view.

The second substrate 20 includes an insulating layer 21, wiring layers 22 and 23, and solder resist layers 24 and 25. The second substrate 20 is stacked over the first substrate 10 so that a second surface 20b of the second substrate 20, on the wiring layer 23 side, faces toward the first surface 10a of the first substrate 10, on the wiring layer 12 side. The second surface 20b of the second substrate 20 includes the second surface of the wiring layer 23 and the second surface of the solder resist layer 25.

The material and thickness of the insulating layer 21 may be the same as those of the insulating layer 11, for example. The wiring layer 22 includes vias (vertical interconnects) filling in via holes 21x, piercing through the insulating layer 21 to expose the first surface of the wiring layer 23, and wiring patterns formed on the first surface of the insulating layer 21. The material of the wiring layer 22 and the thickness of the wiring patterns of the wiring layer 22 may be the same as the material and thickness, respectively, of the wiring layer 12, for example.

Each via hole 21x has the shape of an inverted truncated cone, and has an upper-side opening and a lower-side opening that are open at the first surface and the second surface, respectively, of the insulating layer 21. The upper-side opening is greater in diameter than the lower-side opening.

The wiring layer 23 is formed on the second surface of the insulating layer 21. The first surface of the wiring layer 23 is in contact with and electrically connected to the lower ends of the vias of the wiring layer 22 in the via holes 21x. The material and thickness of the wiring layer 23 may be the same as those of the wiring layer 12, for example. Furthermore, another wiring layer may be provided in the insulating layer 21 to make the second substrate 20 a multilayer wiring substrate.

The solder resist layer 24 is formed on the first surface of the insulating layer 21 to cover the wiring layer 22. The material and thickness of the solder resist layer 24 may be the same as those of the solder resist layer 15, for example. The solder resist layer 24 includes openings 24x, in each of which part of the wiring layer 22 is exposed. Part of the wiring layer 22 exposed in each opening 24x serves as a pad that connects to the second semiconductor chip 80.

The solder resist layer 25 is formed on the second surface of the insulating layer 21 to cover the wiring layer 23. The material and thickness of the solder resist layer 25 may be the same as those of the solder resist layer 15, for example. The solder resist layer 25 includes openings 25x, in each of which part of the wiring layer 23 is exposed. Part of the wiring layer 23 exposed in each opening 25x serves as a pad (second pad) that connects to one of the substrate connecting members 30. Part of the wiring layer 23 exposed in each opening 25x is at a position corresponding to (coinciding with) one of electrodes 80a of the second semiconductor chip 80, and at least overlaps the bleed-out area E (over the underfill resin 50 extending outward from the first semiconductor chip 40), that is, is partly or entirely in the bleed-out area E, in a plan view.

The above-described metal layer may be formed on the first surface of the wiring layer 22 exposed in the openings 24x and/or the second surface of the wiring layer 23 exposed in the openings 25x, as required. Instead of forming the metal layer, anti-oxidation treatment, such as an OSP process, may be performed.

The substrate connecting members 30 are pillar members that are interposed between and electrically connect the first substrate 10 and the second substrate 20. The substrate connecting members 30 are inclined at an inclination angle θ (θ<90°) to the first surface 10a of the first substrate 10 and the second surface 20b of the second substrate 20. Thus, the substrate connecting members 30 extend obliquely between the first substrate 10 and the second substrate 20. The inclination angle θ may be, for example, approximately 60° to approximately 80°. The substrate connecting members 30 are disposed around the first semiconductor chip 40, for example, in a peripheral arrangement, in a plan view. All of the substrate connecting members 30 are inclined in a direction to bring their respective upper-side portions closer to the first semiconductor chip 40. The technical significance of disposing the substrate connecting members 30 at an angle to the first substrate 10 (the second substrate 20) is described below.

Each substrate connecting member 30 includes, for example, a pillar-shaped core 31 and solder plating 32 that coats the outer circumferential surface of the core 31. The core 31 may have, for example, a columnar shape or a prism shape. Each substrate connecting member 30 has a first (upper-side) end joined to the wiring layer 23 exposed in one of the openings 25x and a second (lower-side) end joined to the wiring layer 12 exposed in one of the openings 15x. To be more specific, with respect to each substrate connecting member 30, the solder plating 32 extends onto and is joined to the wiring layer 23 exposed in one of the openings 25x and the wiring layer 12 exposed in one of the openings 15x. Furthermore, a first (upper-side) end of the core 31 is in contact with the wiring layer 23 exposed in one of the openings 25x, and a second (lower-side) end of the core 31 is in contact with the wiring layer 12 exposed in one of the openings 15x. As a result, it is possible to ensure a predetermined interval between the first substrate 10 and the second substrate 20.

Either an electrically conductive material, such as metal, or an insulating material, such as resin, may be used as a material for the core 31. Preferably, an electrically conductive material, such as metal (for example, copper), is used, because the use of an electrically conductive material makes it possible to reduce the resistance of the substrate connecting members 30. Suitable materials for the solder plating 32 include, for example, a Pb alloy, a Sn—Cu alloy, a Sn—Sb alloy, a Sn—Ag alloy, and a Sn—Ag—Cu alloy. The diameter of the substrate connecting members 30 may be, for example, approximately 50 μm to approximately 100 μm. The pitch of the substrate connecting members 30 may be, for example, approximately 150 μm to approximately 200 μm.

The mold resin 60 fills in the space between the first surface 10a of the first substrate 10 and the second surface 20b of the second substrate 20, which are opposite to each other, to encapsulate the substrate connecting members 30, the first semiconductor chip 40, and the underfill resin 50. Suitable materials for the mold resin 60 include, for example, an insulating resin, such as a thermosetting epoxy resin, that contains a filler. The mold resin 60 is a typical example of a second resin according to embodiments of the present invention.

The bumps 70 are formed on the second surface of the wiring layer 14 exposed in the openings 16x of the solder resist layer 16 of the first substrate 10. The bumps 70, however, may be formed on an as-needed basis. For example, solder bumps may be used as the bumps 70. The material of solder bumps may be the same as the material of the solder plating 32, for example.

The second semiconductor chip 80 is mounted face down on a first surface 20a of the second substrate 20 (including the first surface of the solder resist layer 24 and the first surface of the wiring layer 22) by flip chip bonding, so that the second surface of the second semiconductor chip 80, on which a circuit is formed, faces toward the first surface 20a of the second substrate 20. The bumps 90 electrically connect the first surface of the wiring layer 22 exposed in the openings 24x of the solder resist layer 24 of the second substrate 20 and the electrodes 80a of the second semiconductor chip 80. For example, solder bumps may be used as the bumps 90. The material of solder bumps may be the same as the material of the solder plating 32, for example. Surface-mount components, such as resistors and capacitors, may also be mounted on the first surface 20a of the second substrate 20.

Next, a method of manufacturing a semiconductor device according to the first embodiment is described. FIGS. 2A-3J are diagrams depicting a process of manufacturing a semiconductor device according to the first embodiment.

Figure 2A:
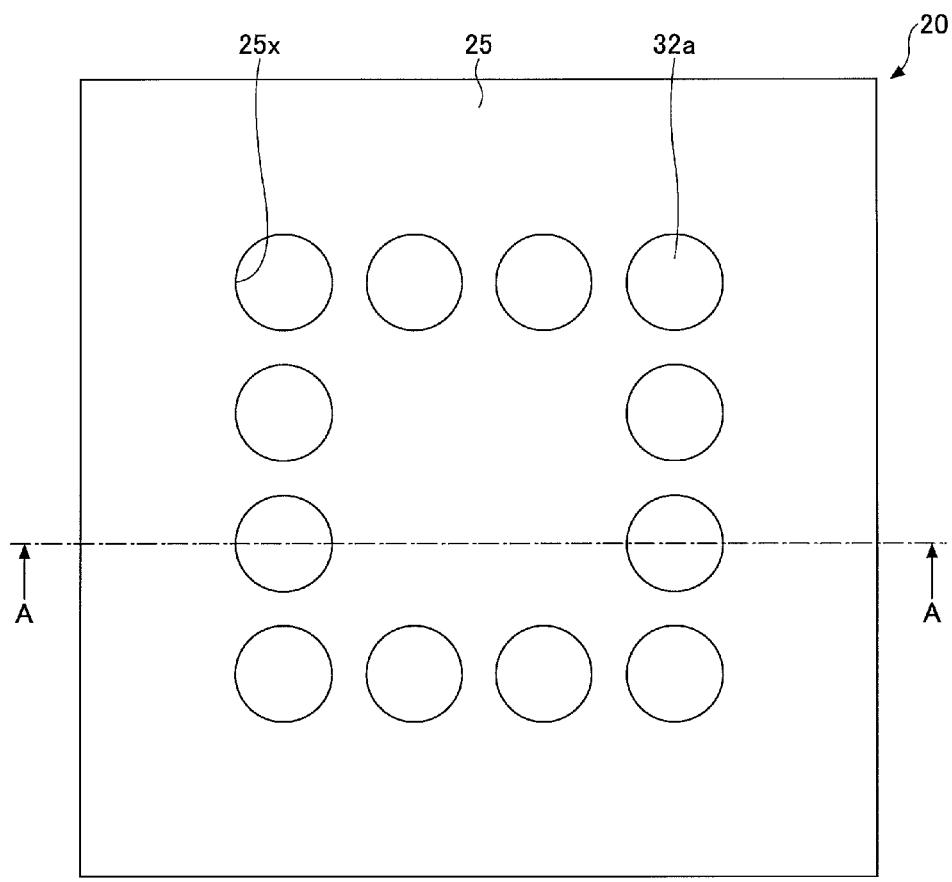
FIGS. 2A and 2B are diagrams depicting a process of manufacturing a semiconductor device according to the first embodiment.
Figure 2B:
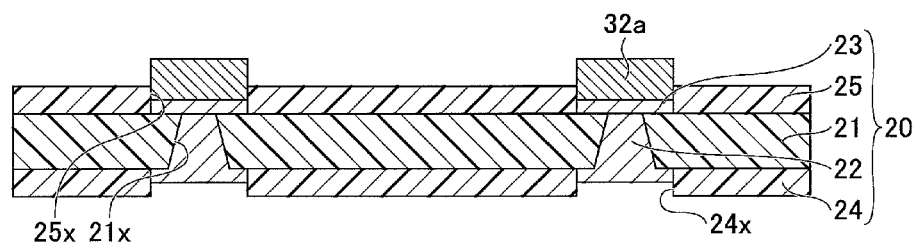

First, in the process depicted in FIGS. 2A and 2B, the second substrate 20 is manufactured, using conventional methods, and solder paste 32a is formed on the wiring layer 23 exposed in the openings 25x of the second substrate 20 by a process, such as printing. FIG. 2A is a plan view of the second substrate 20, and FIG. 2B is a cross-sectional view of the second substrate 20, taken along a line A-A in FIG. 2A. In FIG. 2B, the second substrate 20 is depicted upside down, compared with the state depicted in FIG. 1.

Figure 3A:
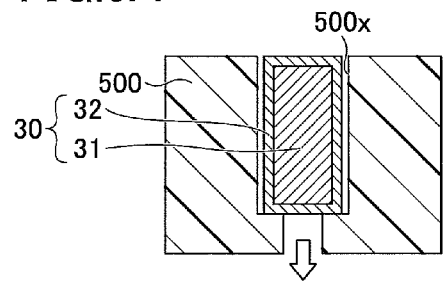
FIGS. 3A-3J are diagrams depicting the process of manufacturing a semiconductor device according to the first embodiment.

Next, in the process depicted in FIG. 3A, a transfer jig 500 provided with multiple accommodation openings 500x is prepared, and the substrate connecting members 30 are attracted in a direction indicated by an arrow to be accommodated in the accommodation openings 500x. The accommodation openings 500x are formed at a pitch that matches a pitch at which the openings 25x of the second substrate 20 are arranged in arrays along the four sides of a square as depicted in FIG. 2A, for example.

Figure 3B:
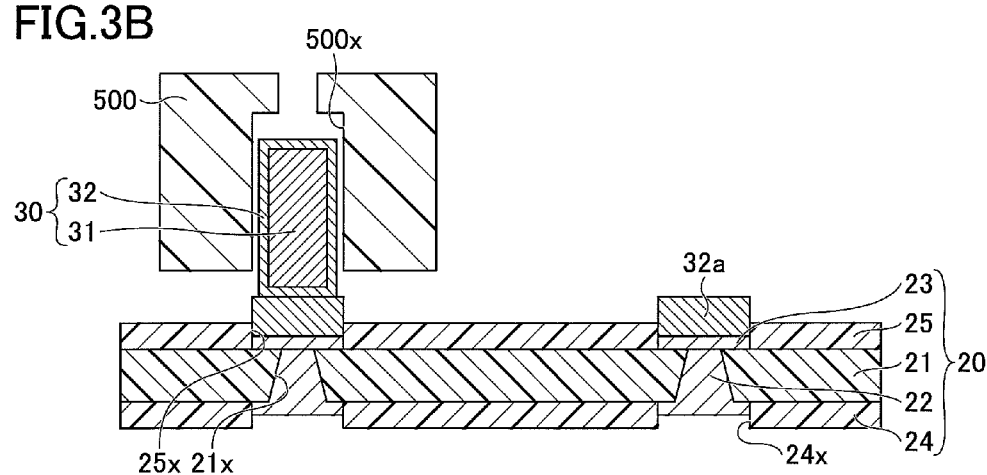

Next, in the process depicted in FIG. 3B, after the transfer jig 500 is inverted and moved to a predetermined position, the attraction of the substrate connecting members 30 is stopped to drop the substrate connecting members 30 onto the solder paste 32a. For example, four of the substrate connecting members 30 are simultaneously and temporarily fixed substantially upright onto the solder paste 32a in four of the openings 25x of the second substrate 20 that are vertically arranged in an array on the left side in the plan view of FIG. 2A.

Figure 3C:
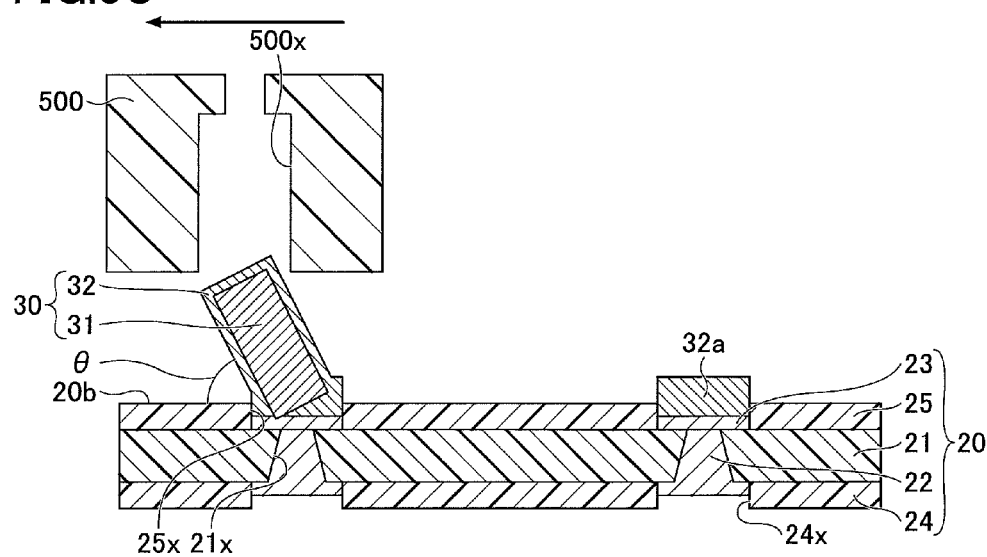

Next, in the process depicted in FIG. 3C, the transfer jig 500 is vertically moved upward to a predetermined position, so that the lower ends of the accommodation openings 500x are positioned close to the upper ends of the corresponding substrate connecting members 30. Thereafter, the transfer jig 500 is horizontally moved. As a result, the upper ends of the substrate connecting members 30 move together with the transfer jig 500 while the lower ends of the substrate connecting members 30 are temporarily fixed to the solder paste 32a. Therefore, the substrate connecting members 30 are inclined relative to the second surface 20b (the top surface in FIG. 3C) of the second substrate 20. Thereafter, the transfer jig 500 is moved upward to a position above the substrate connecting members 30, leaving the substrate connecting members 30 temporarily fixed to the second substrate 20 at the inclination angle θ to its second surface 20b. The amount of movement of the transfer jig 500 in a direction indicated by an arrow in FIG. 3C may be suitably determined in accordance with the inclination angle θ of the substrate connecting members 30 relative to the second surface 20b of the second substrate 20.

Figure 3D:
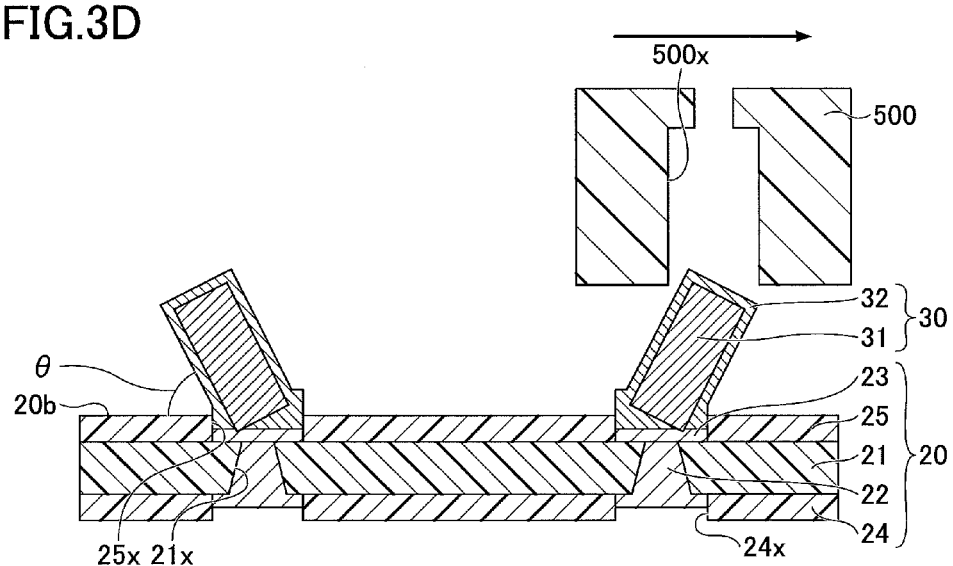

Next, in the process depicted in FIG. 3D, the same process as depicted in FIGS. 3A-3C is performed with respect to other (horizontal and vertical) arrays of the openings 25x of the second substrate 20 depicted in FIG. 2A. As a result, all of the substrate connecting members 30 are temporarily fixed to the second substrate 20 at the inclination angle θ to its second surface 20b.

The process depicted in FIGS. 3A-3C is an example, and the substrate connecting members 30 may be temporarily fixed to the second substrate 20 at the inclination angle θ to its second surface 20b, using other methods. For example, the substrate connecting members 30 do not have to be arranged array by array with respect to the arrays of the openings 25x of the second substrate 20 depicted in FIG. 2A, and the substrate connecting members 30 may be arranged in multiple arrays at the same time. It is possible to arrange the substrate connecting members 30 inclined in different directions in a single operation by configuring the transfer jig 500 so that the arrays of the accommodation openings 500x, corresponding to the arrays of the openings 25x, are independently movable in predetermined directions (for example, four directions in a horizontal plane).

Figure 3E:
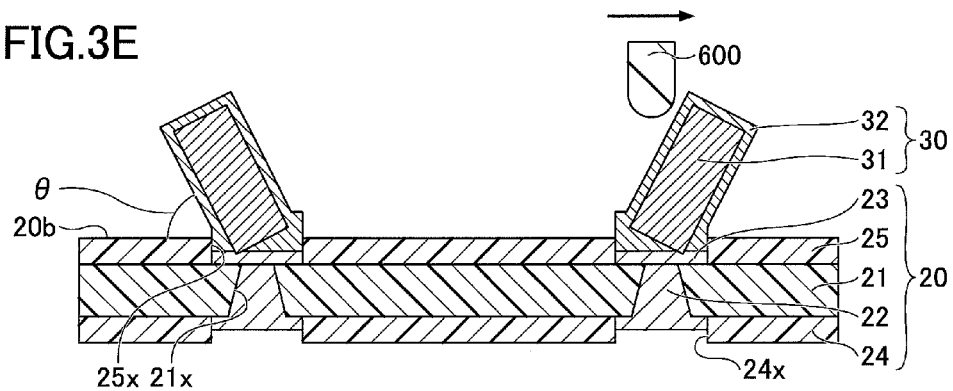

Alternatively, as depicted in FIG. 3E, the substrate connecting members 30 may be inclined, using an inclining jig 600 different from the transfer jig 500. In this case, after the substrate connecting members 30 are temporarily fixed substantially upright onto the solder paste 32a in the process of FIG. 3B, the transfer jig 500 is moved vertically upward to a position above the substrate connecting members 30 and then away from above the second substrate 20. Thereafter, as depicted in FIG. 3E, the inclining jig 600, different from the transfer jig 500, is horizontally moved in a direction indicated by the arrow to temporarily fix the substrate connecting members 30 to the second substrate 20 at the inclination angle θ to its second surface 20b.

Figure 3F:
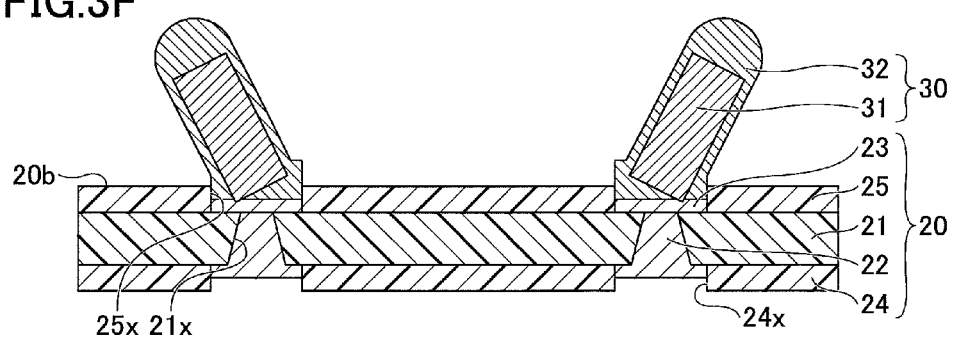

Next, in the process depicted in FIG. 3F, the substrate connecting members 30, temporarily fixed to the second substrate 20 at the inclination angle θ to its second surface 20b, are heated by a process, such as reflow soldering, and are thereafter returned to normal temperature. As a result, the solder paste 32a and the solder plating 32 of the substrate connecting members 30 melt together (into an alloy) and thereafter solidify. At this point, the solder gathers at the end of each substrate connecting member 30 opposite to the second substrate 20 to form, for example, a dome shape. After the substrate connecting members 30 are mounted on the second substrate 20, defluxing may be performed to remove flux as required.

Figure 3G:
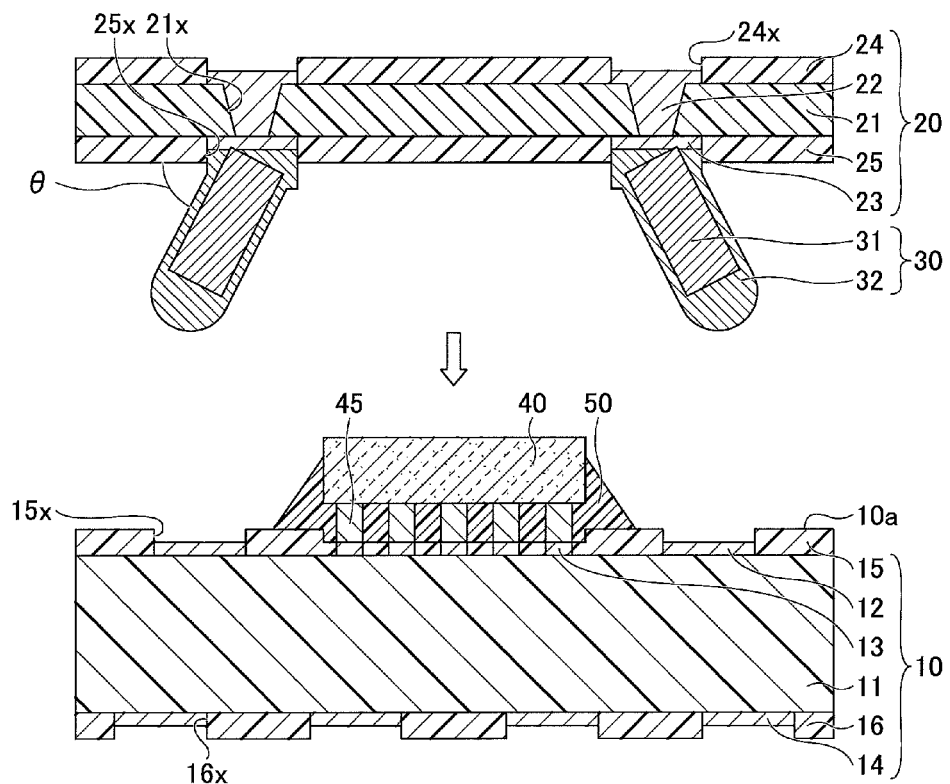

Next, in the process depicted in FIG. 3G, the first substrate 10 is manufactured, using conventional methods, and the first semiconductor chip 40 is mounted face down on the first surface 10a of the first substrate 10 by flip chip bonding. Then, the space between the second surface of the first semiconductor chip 40 and the first surface 10a of the first substrate 10 is filled with the underfill resin 50. Thereafter, the structure depicted in FIG. 3F is inverted and then placed on the first substrate 10. At this point, the lower-side ends of the substrate connecting members 30 are in contact with the first surface of the wiring layer 12 exposed in the openings 15x. Solder paste or the like may be applied in advance to the first surface of the wiring layer 12 exposed in the openings 15x.

Figure 3H:
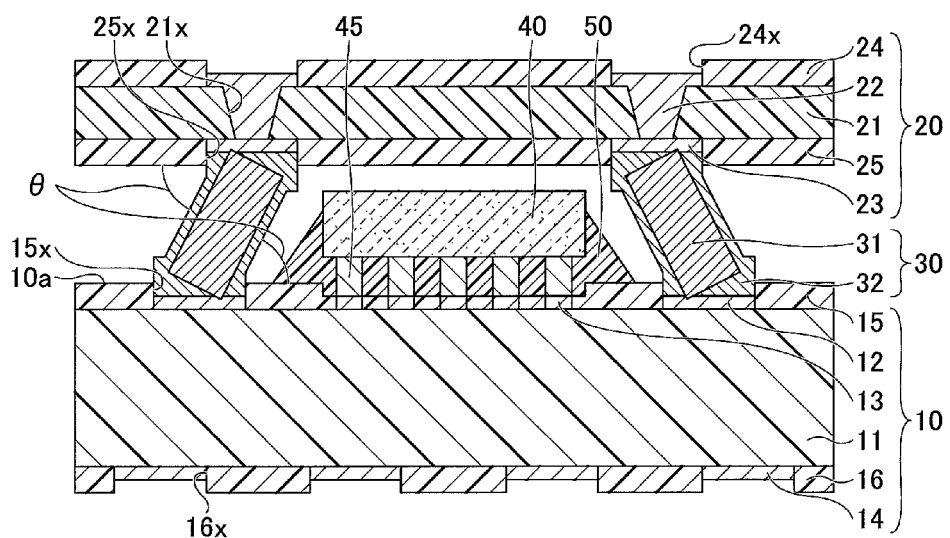

Next, in the process depicted in FIG. 3H, the second substrate 20 is stacked on the first substrate 10 with the substrate connecting members 30 interposed between the first substrate 10 and the second substrate 20. The first substrate 10 and the second substrate 20 may be connected by, for example, thermal compression bonding. That is, while the first substrate 10, the second substrate 20, and the substrate connecting members 30 are being heated, the second substrate 20 is pressed toward the first substrate 10. As a result, the solder plating 32 melts to join the lower-side ends of the substrate connecting members 30 to the first surface of the wiring layer 12 exposed in the openings 15x. At this point, a jig or the like may be used to define an interval between the first substrate 10 and the second substrate 20.

Figure 3I:
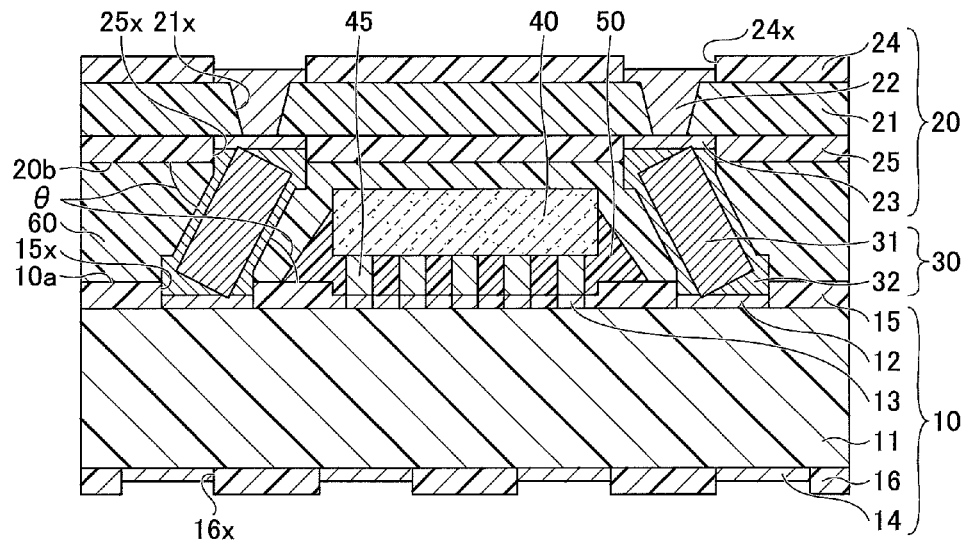

Next, in the process depicted in FIG. 3I, the space between the first surface 10a of the first substrate 10 and the second surface 20b of the second substrate 20 is filled with the mold resin 60, so that the substrate connecting members 30, the first semiconductor chip 40, and the underfill resin 50 are encapsulated with the mold resin 60. Suitable materials for the mold resin 60 include, for example, an insulating resin, such as a thermosetting epoxy resin, that contains a filler. The mold resin 60 may be formed by, for example, transfer molding, using an encapsulation mold.

Figure 3J:
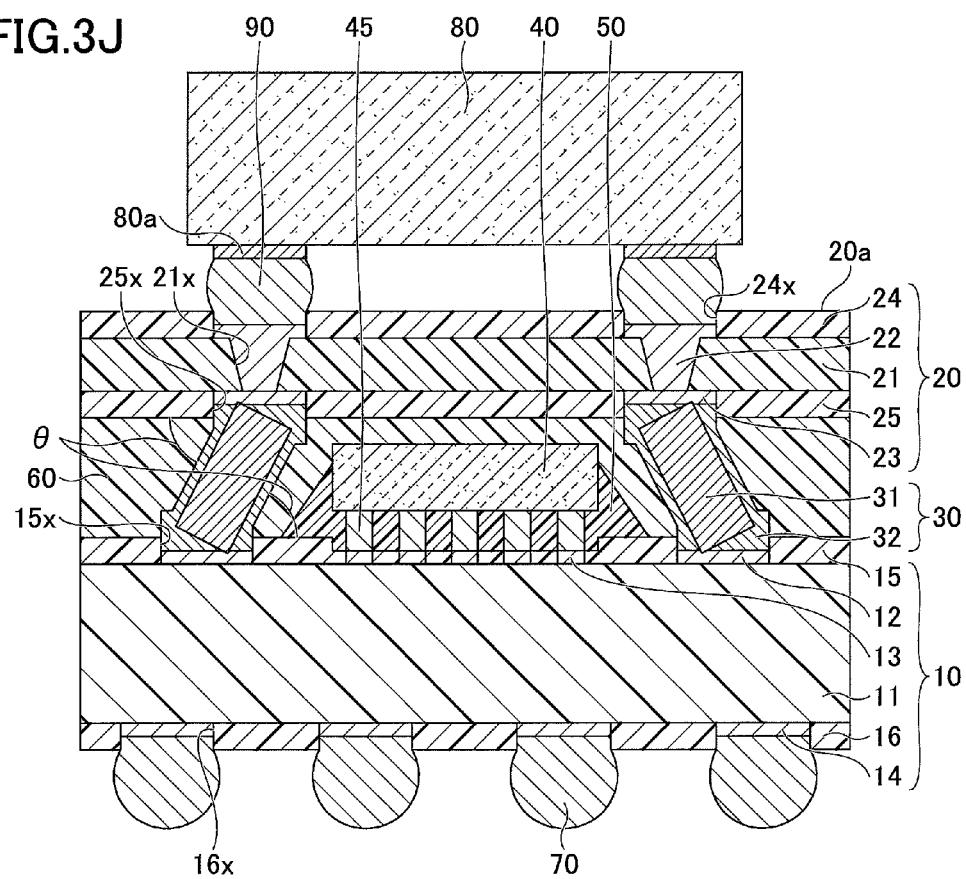

Next, in the process depicted in FIG. 3J, the bumps 70 are formed on the second surface of the wiring layer 14 exposed in the openings 16x of the first substrate 10. Furthermore, the second semiconductor chip 80 are mounted face down on the first surface 20a of the second substrate 20 by flip chip bonding via the bumps 90. The bumps 90 electrically connect the first surface of the wiring layer 22 exposed in the openings 24x of the second substrate 20 and the electrodes 80a of the second semiconductor chip 80. Thereby, the semiconductor device 1 depicted in FIG. 1 is completed.

Figure 4:
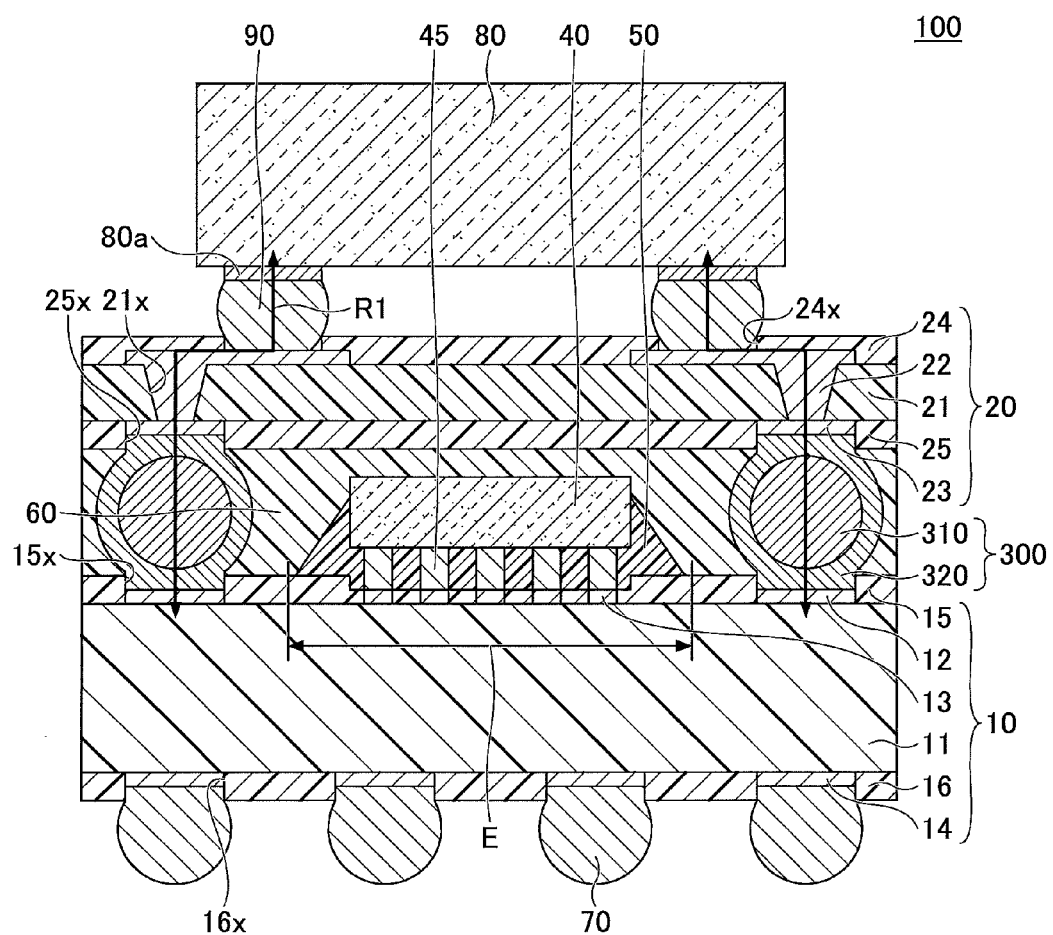
FIG. 4 is a diagram depicting a semiconductor device according to a comparative example.

Here, effects characteristically produced by the semiconductor device 1 are described with reference to a comparative example. FIG. 4 is a diagram depicting a semiconductor device according to a comparative example. Referring to FIG. 4, a semiconductor device 100 of the comparative example differs from the semiconductor device 1 (see FIG. 1) in that the substrate connecting members 30 are replaced with substrate connecting members 300. The substrate connecting members 300 are solder balls, each having a substantially spherical core 310 coated with solder plating 320.

Like the semiconductor device 1, the semiconductor device 100 has the bleed-out area E, and it is not possible to provide the substrate connecting members 300 in the bleed-out area E. Therefore, when the positions of the electrodes 80a of the second semiconductor chip 80 are not aligned with the positions of the substrate connecting members 300 in a plan view, a current path is formed as indicated by an arrow R1 in FIG. 4, and the wiring distance is therefore not minimized. This increases transmission delay and the risk of noise, which may lead to degraded performance or malfunction of the second semiconductor chip 80, depending on its type.

Figure 5:
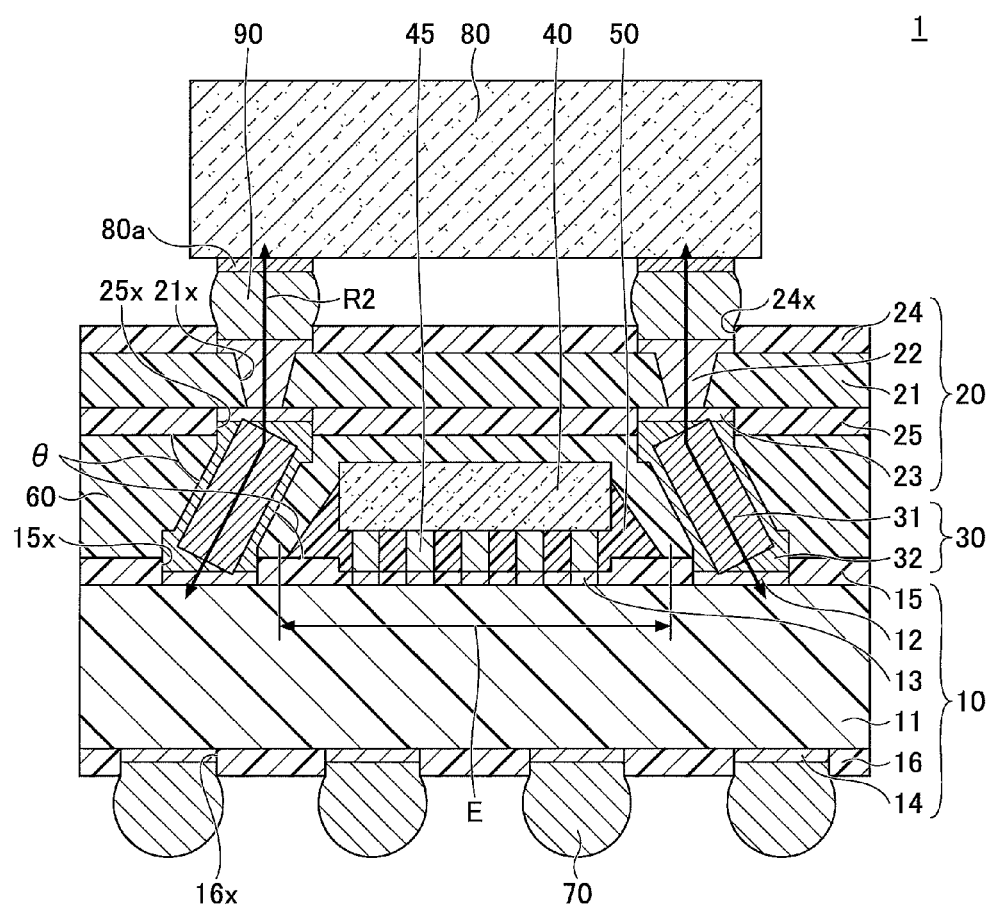
FIG. 5 is a cross-sectional view of the semiconductor device according to the first embodiment, illustrating effects produced by the semiconductor device.

Meanwhile, according to the semiconductor device 1, the substrate connecting members 30 are inclined at the predetermined inclination angle θ as depicted in FIG. 5, so that it is possible to effectively use a region over the bleed-out area E. That is, even when the electrodes 80a of the second semiconductor chip 80 are partly or entirely in the bleed-out area E in a plan view, it is possible to form a current path as indicated by an arrow R2, and it is thereby possible to reduce the wiring distance compared with the comparative example. As a result, it is possible to increase transmission speed and reduce noise.

[b] Second Embodiment

According to a second embodiment, projections are provided to prevent excessive inclination of the substrate connecting members 30. In the following description, the same elements as those described in the first embodiment are referred to by the same reference numeral, and a repetitive description thereof may be omitted.

Figure 6:
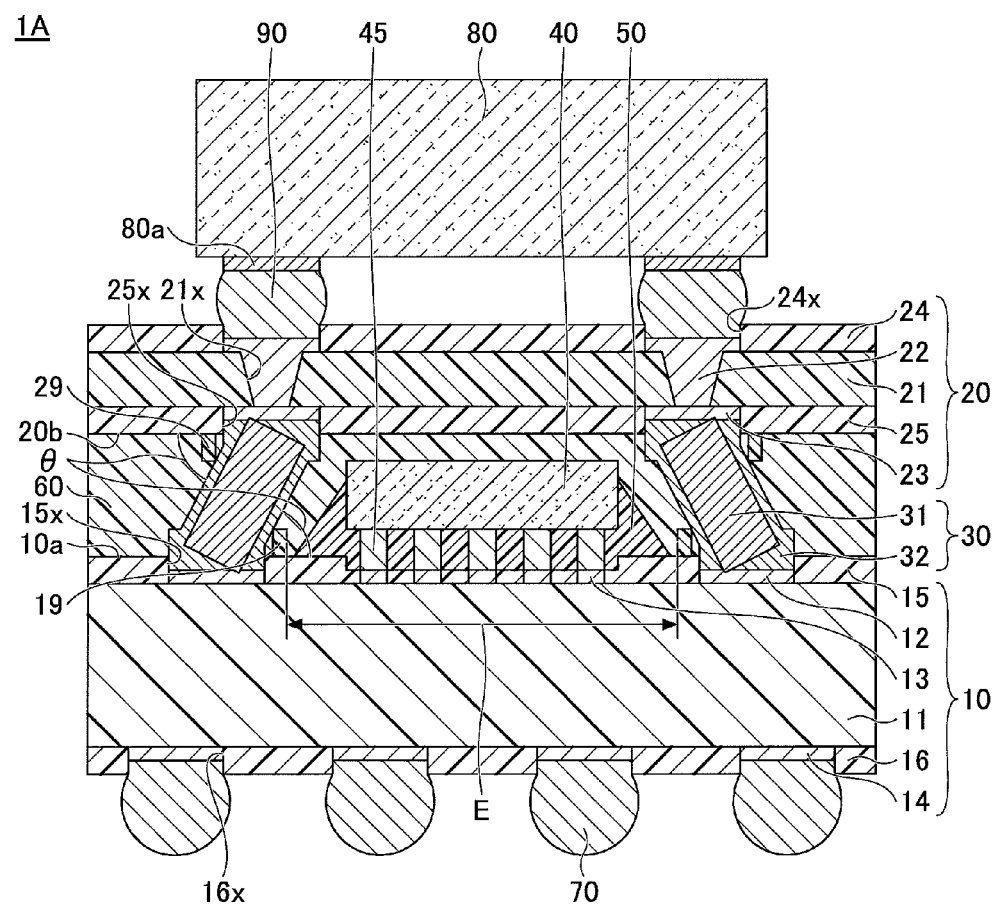
FIG. 6 is a cross-sectional view of a semiconductor device according to a second embodiment.

FIG. 6 is a cross-sectional view of a semiconductor device 1A according to the second embodiment. Referring to FIG. 6, the semiconductor device 1A is different from the semiconductor device 1 of the first embodiment (see FIG. 1) in that first projections 19 and second projections 29 are provided.

The first projections 19 are provided between the openings 15x and the underfill resin 50 on the first surface 10a of the first substrate 10 (the first surface of the solder resist layer 15), facing toward the second substrate 20. The first projections 19 project toward the second substrate 20 to be in contact with the substrate connecting members 30. Likewise, the second projections 29 are provided around the openings 25x on the opposite side of the openings 25x from a position that is over the first semiconductor chip 40 in a plan view, on the second surface 20b of the second substrate 20 (the second surface of the solder resist layer 25), facing toward the first substrate 10. The second projections 29 project toward the first substrate 10 and contact the substrate connecting members 30. By providing the first projections 19 and the second projections 29, it is possible to prevent excessive inclination of the substrate connecting members 30.

FIGS. 7A-7E are diagrams depicting a process of manufacturing a semiconductor device according to the second embodiment.

Figure 7A:
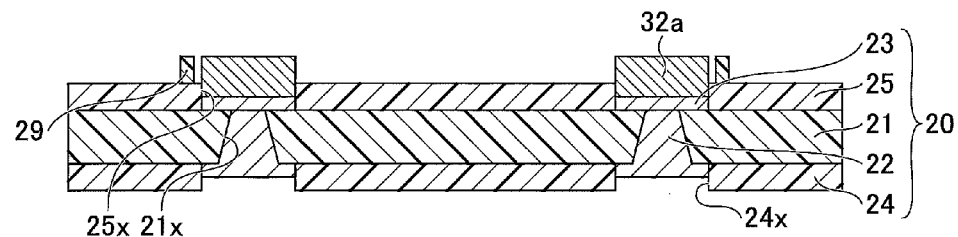
FIGS. 7A-7E are diagrams depicting a process of manufacturing a semiconductor device according to the second embodiment.

First, in the process depicted in FIG. 7A, the second substrate 20 is manufactured, using conventional methods. Then, the second projections 29 are provided to project from the second surface (top surface in FIG. 7A) of the solder resist layer 25 of the second substrate 20. The second projections 29 may be formed by, for example, photolithography, using the same material as the material of the solder resist layer 25. The advantage in this case is that the second projections 29 may be formed during the process of manufacturing the second substrate 20. Alternatively, the second projections 29 may be formed by a process, such as printing or dispensing, using an insulating resin, such as an epoxy resin, or an inorganic material, such as silicon. In this case, the second projections 29 are formed in a separate process after the second substrate 20 is manufactured.

The second projections 29 do not necessarily have to be formed of an insulating material, and may be formed of an electrically conductive material, such as metal. In the case of using metal, however, it is preferable to select a material on which the solder plating 32 is less likely to wet and spread (that is, a material susceptible to surface oxidation).

Furthermore, the second projections 29 are preferably formed of a B-stage resin having adhesiveness. This is because when the substrate connecting members 30 come into contact with the second projections 29 in a subsequent process, the substrate connecting members 30 adhere to the second projections 29, so that a holding force to hold the substrate connecting members 30 increases, thereby making it easier to position the substrate connecting members 30. This is also because it is possible to prevent the substrate connecting members 30, adhering to the second projections 29, from freely moving, even when the solder plating 32 melts when the substrate connecting members 30 are heated by reflow soldering or the like, thus making it possible to further increase the accuracy of positioning the substrate connecting members 30. In this case, when the substrate connecting members 30 are heated by reflow soldering or the like, the B-stage resin is cured to continue holding the substrate connecting members 30.

Figure 7B:
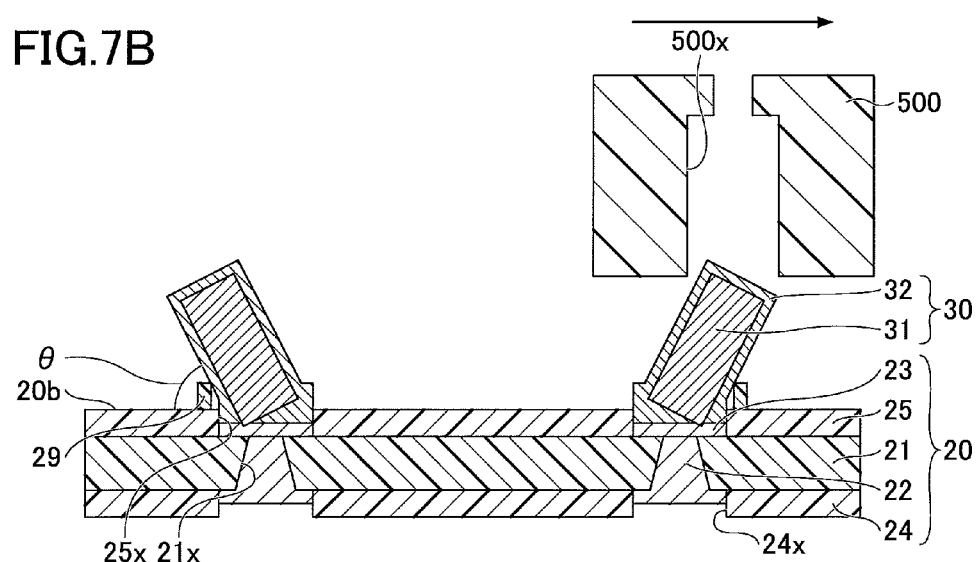
Figure 7C:
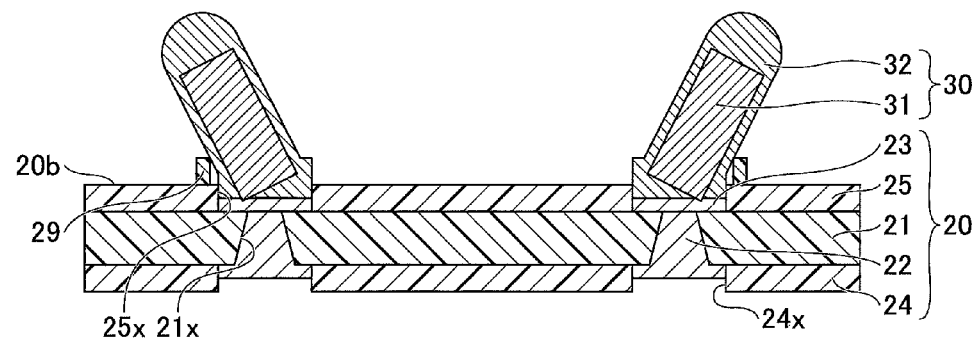

Next, in the process depicted in FIGS. 7B and 7C, the same process as in FIGS. 3A-3F is performed. At this point, the inclination angle θ of the substrate connecting members 30 relative to the second surface 20b of the second substrate 20 is defined by the second projections 29. Accordingly, it is possible to prevent excessive inclination of the substrate connecting members 30. Furthermore, because the substrate connecting members 30 are in contact with the second projections 29, it is possible to increase the accuracy of arrangement (the positioning accuracy in a horizontal direction) of the substrate connecting members 30. Furthermore, in a process corresponding to the process of FIG. 3B, the second projections 29 may be used to position the bottom side of the transfer jig 500 when the transfer jig 500 moves downward. That is, the transfer jig 500 may move downward until coming into contact with the top surfaces of the second projections 29.

Figure 7D:
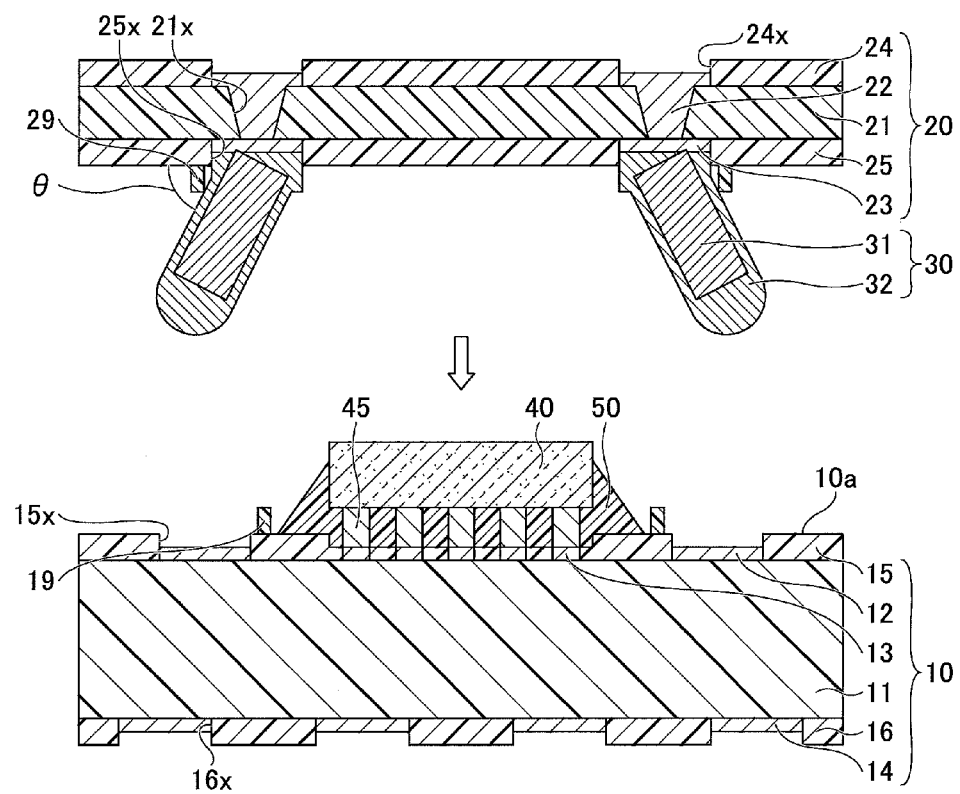

Next, in the process depicted in FIG. 7D, the first substrate 10 is manufactured, using conventional methods. Then, the first projections 19 are provided to project from the first surface of the solder resist layer 15 of the first substrate 10. The first projections 19 may be formed in the same manner as the second projections 29, for example. Thereafter, the first semiconductor chip 40 is mounted face down on the first surface 10a of the first substrate 10 by flip chip bonding. Then, the space between the second surface of the first semiconductor chip 40 and the first surface 10a of the first substrate 10 is filled with the underfill resin 50. Thereafter, the structure depicted in FIG. 7C is inverted to be placed on the first substrate 10. At this point, the inclination angle θ of the substrate connecting members 30 relative to the first surface 10a of the first substrate 10 is defined by the first projections 19 and the second projections 29. Accordingly, it is possible to prevent excessive inclination of the substrate connecting members 30.

Figure 7E:
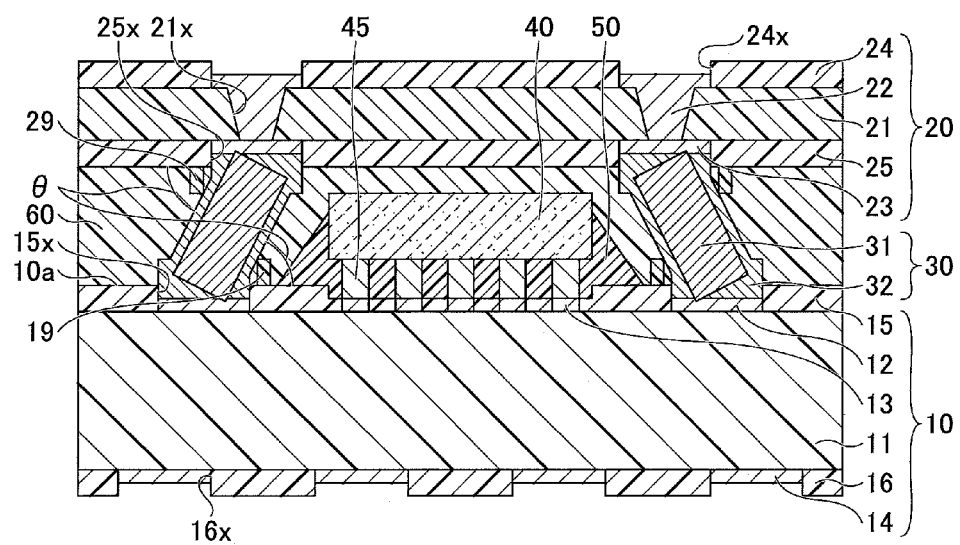

Next, in the process depicted in FIG. 7E, the same process as in FIGS. 3H and 3I is performed. When the space between the first substrate 10 and the second substrate 20 is filled with the mold resin 60, the first substrate 10 and the second substrate 20 may be pressed toward each other by a mold. Even in this case, it is possible to keep the inclination angle θ of the substrate connecting members 30 constant, because the substrate connecting members 30 are in contact with the first projections 19 and the second projections 29, and are thereby prevented from being further inclined.

Next, after the process depicted in FIG. 7E, the same process as in FIG. 3J is performed. Thereby, the semiconductor device 1A depicted in FIG. 6 is completed. At this point, even if the solder plating 32 is heated to a temperature higher than or equal to the melting point, it is possible to prevent the inclination angle θ of the substrate connecting members 30 from being changed by the re-melting of the solder plating 32, because the substrate connecting members 30 are in contact with the first projections 19 and the second projections 29, and are thereby prevented from being further inclined.

Thus, by providing the first projections 19 and the second projections 29, it is possible to improve the accuracy of controlling the inclination angle θ of the substrate connecting members 30. Furthermore, it is possible to prevent the inclination angle θ and the horizontal positions of the substrate connecting members 30 from being changed when an external force, a stress, or heat is applied to the substrate connecting members 30.

Next, variations of the first projections 19 and the second projections 29 described in the second embodiment are described. The first projections 19 and the second projections 29 come into contact with the substrate connecting members 30 to prevent excessive inclination of the substrate connecting members 30. Therefore, as long as it is possible to prevent excessive inclination of the substrate connecting members 30, the first projections 19 and the second projections 29 may have any shape. By way of example, suitable shapes for the first projections 19 are described below. Suitable shapes for the second projections 29 may be the same as those for the first projections 19.

Figure 8A:
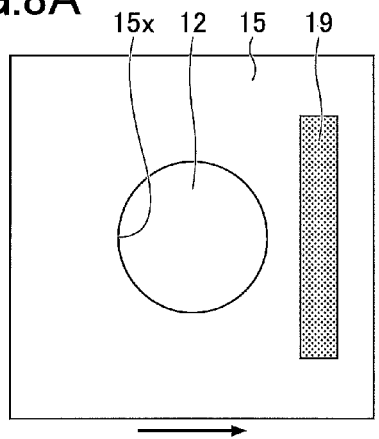
FIGS. 8A-8F are plan views of variations of first projections.
Figure 8B:
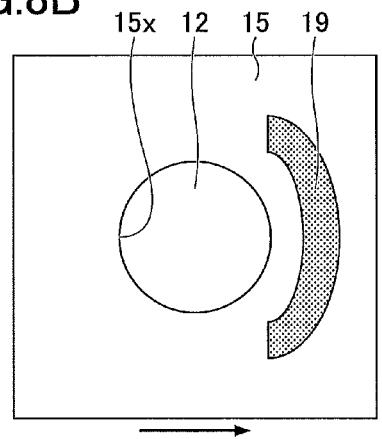

FIGS. 8A-8F are plan views of variations of the first projections 19. By way of example, FIGS. 8A-8F depict one of the first projections 19 (hereinafter referred to as "the first projection 19") and its periphery. In FIGS. 8A-8F, the arrow indicates the direction in which the substrate connecting member 30 corresponding to the depicted first projection 19 is inclined (hereinafter referred to as "the inclination direction of the substrate connecting member 30"). As depicted in FIG. 8A, the first projection 19 may be positioned away from the opening 15x in the inclination direction of the substrate connecting member 30, and may have a planar shape linearly extending in a direction perpendicular to the inclination direction of the substrate connecting member 30. Alternatively, as depicted in FIG. 8B, the first projection 19 may be positioned away from the opening 15x in the inclination direction of the substrate connecting member 30, and may have the planar shape of a partial ring extending along the circumference (outer edge) of the opening 15x. Alternatively, although not depicted in the drawings, the first projection 19 may have the planar shape of a ring encircling the opening 15x.

Figure 8C:
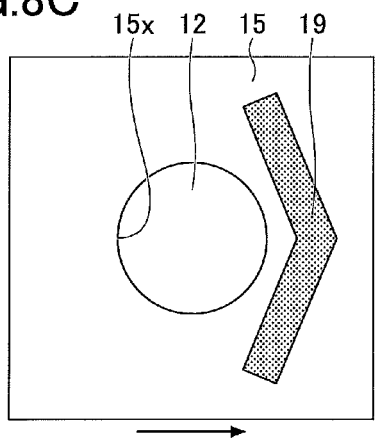
Figure 8D:
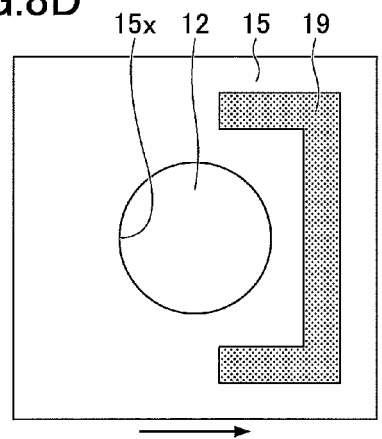
Figure 8E:
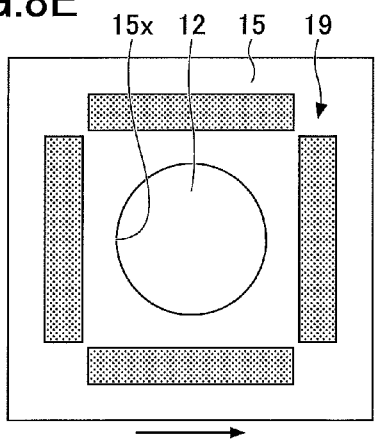
Figure 8F:
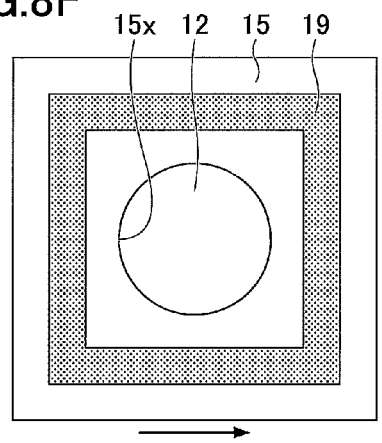

Alternatively, as depicted in FIG. 8C, the first projection 19 may be positioned away from the opening 15x in the inclination direction of the substrate connecting member 30, and may have a doglegged planar shape, formed of two linear portions abutting against each other at a predetermined angle, to protrude in the inclination direction of the substrate connecting member 30. Alternatively, as depicted in FIG. 8D, the first projection 19 may be positioned away from the opening 15x in the inclination direction of the substrate connecting member 30, and may have an angular U-letter planar shape, open in the direction opposite to the inclination direction of the substrate connecting member 30. Alternatively, as depicted in FIG. 8E, the first projection 19 may have a planar shape formed of four linear portions, which are separated from one another and provided at positions corresponding to the four sides of a rectangle to enclose the opening 15x. Alternatively, as depicted in FIG. 8F, the first projection 19 may have the planar shape of a rectangular frame enclosing the opening 15x.

The first projections 19 produce effects as described above, such as the effect that the accuracy of controlling the inclination angle θ of the substrate connecting members 30 is improved, with any of the planar shapes of FIGS. 8A-8F or any of planar shapes similar thereto. In the case of the planar shapes depicted in FIGS. 8B and 8C in particular, the area of contact between the first projections 19 and the substrate connecting members 30 increases, compared with the case of other planar shapes. Accordingly, it is possible to control the inclination direction and the inclination angle θ of the substrate connecting members 30 with more accuracy.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority or inferiority of the invention. Although one or more embodiments of the present invention have been described in detail, it should be understood that the various changes, substitutions, and alterations could be made hereto without departing from the spirit and scope of the invention.

For example, a build-up substrate containing more wiring layers and insulating layers than the first substrate 10 or the second substrate 20 may be used in place of the first substrate 10 or the second substrate 20. In this case, a coreless build-up substrate may be used. Alternatively, a silicon substrate or a ceramic substrate may be used as the first substrate 10 or the second substrate 20.

Furthermore, the upper-side end surfaces and the lower-side end surfaces of the cores 31 of the substrate connecting members 30 do not have to be perpendicular to the longitudinal direction of the cores 31. For example, members whose upper-side end surfaces and lower-side end surfaces are parallel to the first surface 10a of the first substrate 10 and whose longitudinal direction is inclined to the first surface 10a of the first substrate 10 may be used as the cores 31.

Furthermore, while the substrate connecting members 30 are mounted first on the second substrate 20 in the above-described embodiments, the substrate connecting members 30 may alternatively be mounted first on the first substrate 10.

Various aspects of the subject-matter described herein may be set out non-exhaustively in the following numbered clauses:

1. A method of manufacturing a semiconductor device, including:
    preparing a first substrate that includes a mounting surface on which a semiconductor chip is mounted, with a resin interposed between the semiconductor chip and the mounting surface, the resin extending beyond a periphery of the semiconductor chip on the mounting surface, and a first pad forming a part of the mounting surface and disposed outside the resin;
    preparing a second substrate that includes a first surface and a second surface that are on opposite sides of the second substrate, and a second pad forming a part of the second surface; and
    stacking the second substrate over the first substrate so that the second surface of the second substrate faces toward the mounting surface of the first substrate, to electrically connect the first substrate and the second substrate through a pillar member,
    wherein the second pad at least overlaps the resin when viewed in a stacking direction in which the second substrate is stacked over the first substrate, and
    wherein the pillar member extends obliquely between the first substrate and the second substrate, and has a first end joined to the first pad and a second end joined to the second pad.

2. The method of clause 1, further including:
    providing a projection between the first pad and the resin on the mounting surface of the first substrate so that the projection projects toward the second substrate and contacts the pillar member.

3. The method of clause 1, further including:
    providing a projection on an opposite side of the second pad from a position that is over the semiconductor chip when viewed in the stacking direction, on the second surface of the second substrate, so that the projection projects toward the first substrate and contacts the pillar member.

What is claimed is:

1. A semiconductor device, comprising:
    a first substrate, including
        a mounting surface on which a first semiconductor chip is mounted, with a first resin interposed between the first semiconductor chip and the mounting surface, the first resin extending beyond a periphery of the first semiconductor chip on the mounting surface; and
        a first pad forming a part of the mounting surface, the first pad being disposed outside the first resin;
    a second substrate stacked over the first substrate, the second substrate including
        a first surface and a second surface that are on opposite sides of the second substrate, the second surface facing toward the mounting surface of the first substrate; and
        a second pad forming a part of the second surface, the second pad at least overlapping the first resin when viewed in a stacking direction in which the second substrate is stacked over the first substrate; and
    a pillar member extending obliquely between the first substrate and the second substrate, the pillar member having a first end joined to the first pad and a second end joined to the second pad to electrically connect the first substrate and the second substrate.

2. The semiconductor device as claimed in claim 1, wherein
    the pillar member includes a pillar-shaped core having an exterior circumferential surface coated with solder plating, and
    the solder plating extends onto and is joined to the first pad and the second pad.

3. The semiconductor device as claimed in claim 2, wherein the core has first and second opposite ends that are in contact with the first pad and the second pad, respectively.

4. The semiconductor device as claimed in claim 1, further comprising:
    a second semiconductor chip on the first surface of the second substrate,
    wherein the second substrate further includes a via piercing through the second substrate, and
    wherein the second pad and an electrode of the second semiconductor chip are aligned when viewed in the stacking direction and are electrically connected through the via.

5. The semiconductor device as claimed in claim 1, further comprising:
    a projection provided between the first pad and the first resin on the mounting surface of the first substrate, and projecting toward the second substrate and contacting the pillar member.

6. The semiconductor device as claimed in claim 1, further comprising:
    a projection provided on the second surface of the second substrate, and projecting toward the first substrate and contacting the pillar member, the projection being on an opposite side of the second pad from a position that is over the first semiconductor chip when viewed in the stacking direction.

7. The semiconductor device as claimed in claim 1, further comprising:
    a second resin filling in a space between the first substrate and the second substrate.

* * * * *